(12) United States Patent  (10) Patent No.: US 12,087,892 B2
Liang et al.  (45) Date of Patent: Sep. 10, 2024

(54) SUPPORTING BACKPLANE, MANUFACTURING METHOD THEREFOR AND BACKPLANE

(71) Applicant: BOE TECHNOLOGY GROUP CO., LTD., Beijing (CN)

(72) Inventors: Zhiwei Liang, Beijing (CN); Wenqian Luo, Beijing (CN); Zhijun Lv, Beijing (CN); Yingwei Liu, Beijing (CN); Ke Wang, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 907 days.

(21) Appl. No.: 17/043,937

(22) PCT Filed: Oct. 31, 2019

(86) PCT No.: PCT/CN2019/114767
§ 371 (c)(1),
(2) Date: Sep. 30, 2020

(87) PCT Pub. No.: WO2021/081906
PCT Pub. Date: May 6, 2021

(65) Prior Publication Data
US 2023/0131247 A1  Apr. 27, 2023

(51) Int. Cl.
*H01L 33/62* (2010.01)
*H01L 23/00* (2006.01)

(52) U.S. Cl.
CPC ............. *H01L 33/62* (2013.01); *H01L 24/05* (2013.01); *H01L 24/11* (2013.01); *H01L 24/13* (2013.01);
(Continued)

(58) Field of Classification Search
CPC ......... H01L 33/62; H01L 24/05; H01L 24/11; H01L 24/13; H01L 24/16; H01L 24/81;
(Continued)

(56) References Cited

U.S. PATENT DOCUMENTS 5,457,879 A  10/1995  Gurtler et al.
9,978,710 B2  5/2018  Dubey et al.
(Continued)

FOREIGN PATENT DOCUMENTS

CN  106057771 A  10/2016

OTHER PUBLICATIONS

Office Action dated Apr. 21, 2023 issued in corresponding Chinese Application No. 201980002236.X.

*Primary Examiner* — Ratisha Mehta
(74) *Attorney, Agent, or Firm* — Nath, Goldberg & Meyer; Joshua B. Goldberg (57) ABSTRACT

The present disclosure provides a supporting substrate, including: a base substrate and a plurality of connecting electrodes provided on the base substrate, wherein a clamping electrode is provided on a side of at least one of the connecting electrodes facing away the base substrate, the clamping electrode is electrically connected with a corresponding connecting electrode and configured to be capable of clamping and fixing an electrode pin of the micro-light emitting device. The present disclosure also provides a manufacturing method for the supporting substrate, and a backplane.

20 Claims, 8 Drawing Sheets

(52) U.S. Cl.
CPC .............. *H01L 24/16* (2013.01); *H01L 24/81*
(2013.01); *H01L 2224/05655* (2013.01); *H01L*
*2224/0568* (2013.01); *H01L 2224/1145*
(2013.01); *H01L 2224/11622* (2013.01); *H01L*
*2224/13011* (2013.01); *H01L 2224/13014*
(2013.01); *H01L 2224/13016* (2013.01); *H01L*
*2224/13124* (2013.01); *H01L 2224/16057*
(2013.01); *H01L 2224/1607* (2013.01); *H01L*
*2224/16238* (2013.01); *H01L 2224/81193*
(2013.01); *H01L 2224/81201* (2013.01); *H01L*
*2224/81345* (2013.01); *H01L 2224/81898*
(2013.01)

(58) Field of Classification Search
CPC ... H01L 2224/05655; H01L 2224/0568; H01L
2224/1145; H01L 2224/11622; H01L
2224/13011
See application file for complete search history.

(56) References Cited

U.S. PATENT DOCUMENTS

| | | | |
|---|---|---|---|
| 2002/0094707 A1 | 7/2002 | Hedler | |
| 2015/0014865 A1* | 1/2015 | Frueh | H01L 24/83 |
| | | | 438/119 |
| 2015/0235984 A1* | 8/2015 | Aoyagi | H01L 24/03 |
| | | | 228/1.1 |
| 2016/0293565 A1* | 10/2016 | Choi | H01L 25/0756 |
| 2017/0194283 A1 | 7/2017 | Dubey et al. | |
| 2020/0028044 A1* | 1/2020 | Lee | H01L 27/124 |
| 2021/0336105 A1* | 10/2021 | Zhang | H01L 25/167 |

* cited by examiner

```
Forming a plurality of connecting electrodes     — S100
         on a base substrate Forming a clamping electrode on a side of at
least one of the connecting electrodes facing
    away the base substrate, the clamping
electrode being electrically connected with a    — S200
   corresponding connecting electrode and
   configured to be capable of clamping and
   fixing an electrode pin of a micro-light
               emitting device
```

FIG. 4

```
┌─────────────────────────────────────────────┐
│ Coating a first photoresist on the base     │
│ substrate and on a side of the connecting   │──── S201
│ electrode facing away the base substrate,   │
│ the first photoresist being a negative      │
│ photoresist                                 │
└─────────────────────────────────────────────┘
                      ↓
┌─────────────────────────────────────────────┐
│ Exposing and developing the first           │
│ photoresist to form an open groove in an    │
│ area where the clamping electrode is to be  │──── S202
│ formed, an inscribed angle formed by a      │
│ sidewall of the first photoresist, which    │
│ encloses the open groove, and a plane       │
│ parallel to the base substrate being an     │
│ acute angle                                 │
└─────────────────────────────────────────────┘
                      ↓
┌─────────────────────────────────────────────┐
│ Forming a conductive material film on the   │
│ side of the first photoresist facing away   │──── S203
│ the base substrate and in the open groove   │
└─────────────────────────────────────────────┘
                      ↓
┌─────────────────────────────────────────────┐
│ Removing a part of the conductive material  │
│ film on the side of the first photoresist   │
│ facing away the base substrate, the part of │──── S204
│ the conductive material film in the open    │
│ groove being used as the clamping electrode │
└─────────────────────────────────────────────┘
```

SUPPORTING BACKPLANE, MANUFACTURING METHOD THEREFOR AND BACKPLANE

This application is a National Phase Application filed under 35 U.S.C. 371 as a national stage of PCT/CN2019/114767, filed on Oct. 31, 2019.

TECHNICAL FIELD

The present disclosure relates to a supporting substrate, a manufacturing method for the supporting substrate, and a backplane.

BACKGROUND

Micro light emitting diode (Micro LED) is a device with a size of a few micrometers to a few hundred micrometers. When in use, the micro LED is first grown on a supply substrate, and then transferred by using a micro-transfer printing technology to a supporting substrate having a circuit pattern for bonding.

SUMMARY

The present disclosure provides a supporting substrate, a manufacturing method for the supporting substrate, and a backplane.

In a first aspect, embodiments of the present disclosure provide a supporting substrate, including: a base substrate and a plurality of connecting electrodes provided on the base substrate, wherein a clamping electrode is provided on a side of at least one of the connecting electrodes facing away the base substrate, the clamping electrode being electrically connected with a corresponding connecting electrode, and configured to be capable of clamping and fixing an electrode pin of a micro-light emitting device.

In some embodiments, the clamping electrode includes: a side conductive portion extending toward a direction away from the base substrate, an inscribed angle formed by the side conductive portion and a plane parallel to the base substrate being an acute angle.

In some embodiments, a range of the inscribed angle includes [60°, 70°].

In some embodiments, the clamping electrode further includes: a bottom conductive portion located between the side conductive portion and the connecting electrodes;

an end face of the side conductive portion facing the base substrate is connected with the bottom conductive portion.

In some embodiments, the side conductive portion and the bottom conductive portion are of an integrally formed structure.

In some embodiments, an orthographic projection of the side conductive portion on the base substrate is in a shape of a ring.

In some embodiments, an orthographic projection of the side conductive portion on the base substrate is in a shape of a ring having at least one gap extending through inner and outer boundaries of the ring.

In some embodiments, the clamping electrode is provided on a side of each of the connecting electrodes facing away the base substrate.

In some embodiments, the material of the clamping electrode includes aluminum.

In a second aspect, embodiments of the present disclosure further provide a manufacturing method for a supporting substrate, including:

forming a plurality of connecting electrodes on a base substrate; and forming a clamping electrode on a side of at least one of the connecting electrodes facing away the base substrate, the clamping electrode being electrically connected with a corresponding connecting electrode, and configured to be capable of clamping and fixing an electrode pin of a micro-light emitting device.

In some embodiments, the step of forming the clamping electrode includes:

coating a first photoresist on the base substrate and on a side of the connecting electrodes facing away the substrate, the first photoresist being a negative photoresist;

exposing and developing the first photoresist to form an open groove in an area where the clamping electrode is to be formed, an inscribed angle formed by a sidewall enclosing the open groove and a plane parallel to the base substrate being an acute angle;

forming a conductive material film on the side of the first photoresist facing away the base substrate and in the open groove; and removing a part of the conductive material film on the side of the first photoresist facing away the base substrate, wherein the part of the conductive material film in the open groove is used as the clamping electrode.

In some embodiments, after the step of removing the part of the conductive material film on the side of the first photoresist facing away the base substrate, the method further includes:

removing residual first photoresist.

In some embodiments, the step of removing the part of the conductive material film on the side of the first photoresist facing away the base substrate includes:

coating a second photoresist on a side of the conductive material film facing away the base substrate and in the open groove;

removing the second photoresist of a predetermined thickness to expose the part of the conductive material film on the side of the first photoresist facing away the base substrate; and removing the part of the conductive material film on the side of the first photoresist facing away the base substrate by an etching process.

In some embodiments, the second photoresist of a predetermined thickness is removed by using a plasma etching process.

In a third aspect, embodiments of the present disclosure further provide a backplane, including: the supporting substrate of the first aspect of the present disclosure.

In some embodiments, the backplane further includes: at least one micro-light emitting device, the micro-light emitting device including a micro-light emitting device body and a plurality of electrode pins electrically connected with the micro-light emitting device body, wherein at least one electrode pin of the micro-light emitting device is clamped and fixed by the clamping electrode.

In some embodiments, the electrode pin clamped and fixed by the clamping electrode includes: a first electrode portion and a second electrode portion which are stacked, the second electrode portion being electrically connected with the micro-light emitting device body through the first electrode portion; a hardness of the second electrode portion being smaller than a hardness of the first electrode portion.

In some embodiments, the clamping electrode clamps and fixes a corresponding second electrode portion.

In some embodiments, the micro-light emitting device includes: Micro-LED or Mini-LED.

In some embodiments, the backplane is a display substrate or a light source assembly.

BRIEF DESCRIPTION OF THE DRAWINGS

FIGS. 8a and 8b are perspective views of a partial structure of the display substrate in a state shown in FIG. 7a.

DETAILED DESCRIPTION

In order to make those skilled in the art better understand the present disclosure, the supporting backplane, manufacturing method thereof and backplane provided by the present disclosure are described in detail below with reference to the accompanying drawings.

Example embodiments will be described more fully hereinafter with reference to the accompanying drawings, but which may be embodied in different forms and should not be construed as limited to the embodiments set forth herein. Rather, these embodiments are provided so that this present disclosure will be thorough and complete, and will fully convey the scope of the present disclosure to those skilled in the art.

The terminology used in the present disclosure is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "include", "including", "comprise", "comprising" "comprised of" or derivatives thereof as used throughout the specification are taken to specify the presence of stated features, integers, steps, operations, elements, and/or components referred to, but not preclude the presence or addition of one or more other feature/s, integer/s, step/s, operation/s, element/s, components, and/or group/s thereof. It will be understood that, although the terms first, second, etc. may be used herein to describe various elements/components/structures, these elements/components/structures should not be limited by these terms. These terms are only used to distinguish one element/component/structure from another element/component/structure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The micro-light emitting device referred to in the present disclosure refers to a light emitting device of a small size, such as a micro LED or a mini LED, the overall size of the micro LED is typically below 50 μm, the overall size of the mini LED is typically between 100 μm-200 μm, and the micro LED will be exemplified in the present disclosure.

The micro-light emitting diode in the related art is bound in a plug-in mode. Specifically, a micro-tube electrode made of a hard metal material is provided on a connecting electrode in the supporting substrate, an electrode pin (connected with a cathode or an anode on the micro-light emitting diode) made of a soft metal material is provided on the micro-light emitting diode, and the micro-tube electrode is inserted into the electrode pin during a bonding process so as to realize electrical connection between the connecting electrode and the micro-light emitting diode. However, in practical applications, it has been found that when a micro-tube electrode is inserted into an electrode pin, the micro-tube electrode easily penetrates the electrode pin, thereby damaging the micro-light emitting diode.

Figure 1:
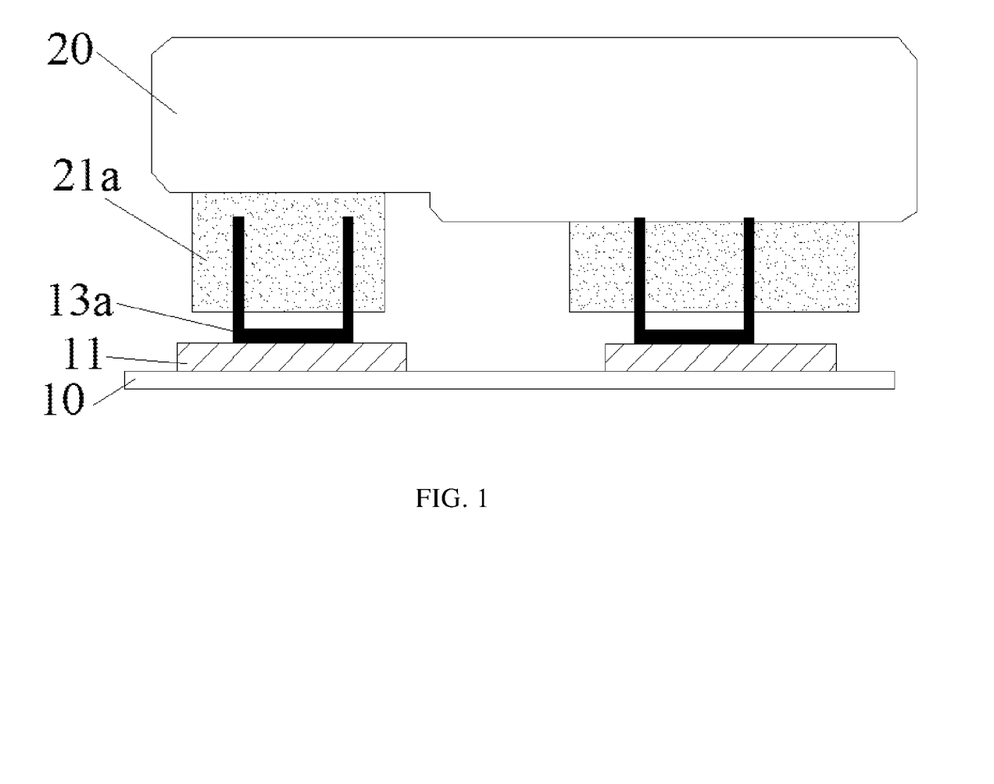
FIG. 1 is a schematic diagram of a structure of a display substrate having micro-light emitting devices in the related art.

Referring to FIG. 1, display substrate in the related art includes a micro-light emitting device and a supporting substrate. Wherein, the micro-light emitting device includes a micro-light emitting device body 20 and electrode pins 21a (generally two, connected with the cathode and the anode of the micro-light emitting device body 20, respectively), wherein a light emitting structure such as a PN junction or a PIN junction, and a peripheral encapsulation material is provided in the micro-light emitting device body 20; the electrode pins 21a are generally made of a relatively soft metal such as aluminum.

A base substrate 10 of the supporting substrate is provided with a signal trace (not shown), a driving circuit (not shown), a connecting electrode 11, and the like. A cylindrical electrode 13a (i.e., a micro-tube electrode) with an opening on the top surface is provided on the connecting electrode 11, and the cylindrical electrode 13a is made of a hard metal; when the micro-light emitting device is bonded, the hard cylindrical electrode 13a needs to be inserted into the soft electrode pin 21a.

The connecting electrode 11 may be a portion at an end of the signal trace or a portion that is additionally provided and electrically connected with the signal trace.

In the bonding process, since it is difficult to control the pressure applied and the depth of the cylindrical electrode 13a inserted into the electrode pin 21a, the cylindrical electrode 13a would easily penetrates the electrode pin 21a, thereby damaging the micro-light emitting device body.

Figure 2:
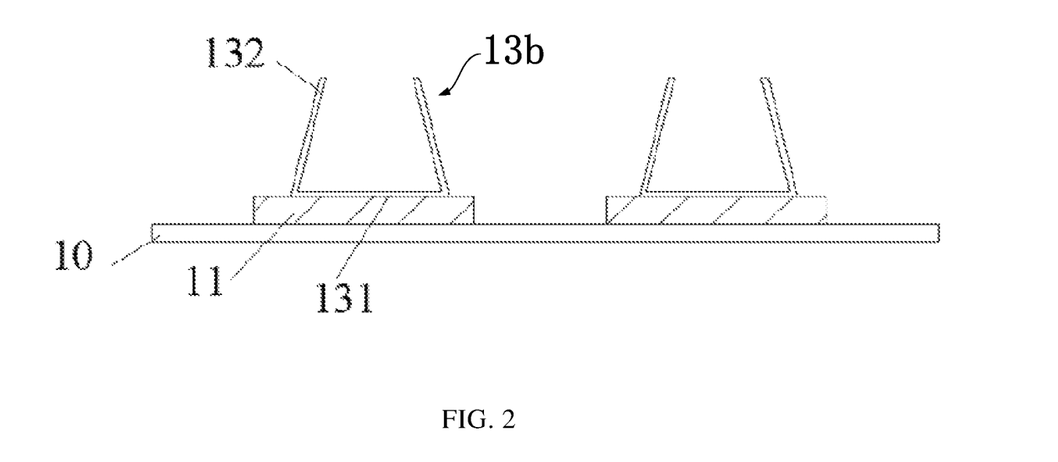
FIG. 2 is a schematic diagram of a structure of a supporting substrate according to an embodiment of the present disclosure.

To solve the above technical problem, an embodiment of the present disclosure provides a supporting substrate. Referring to FIG. 2, the supporting substrate includes: a base substrate 10 and a plurality of connecting electrodes 11 provided on the base substrate 10, wherein a clamping electrode 13b is provided on a side of at least one of the connecting electrodes 11 facing away the base substrate 10, the clamping electrode 13b being electrically connected with a corresponding connecting electrode 11, and configured to clamp and fix electrode pins of the micro-light emitting device.

Figure 3:
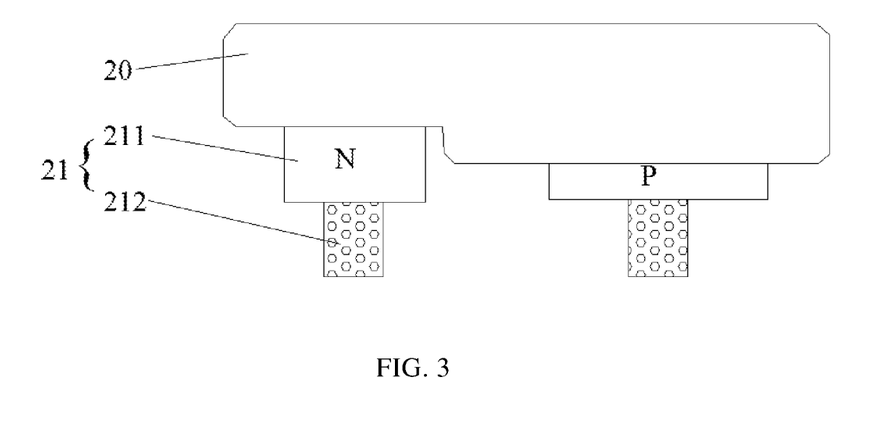
FIG. 3 is a schematic diagram of a structure of a micro-light emitting device according to an embodiment of the present disclosure.

The supporting substrate according to the embodiment of the present disclosure is used for receiving a micro-light emitting device; wherein the micro-light emitting device may be a lateral micro-light emitting diode or a longitudinal micro-light emitting diode. FIG. 3 shows a structure of a lateral micro-LED that includes a micro-light emitting device body 20 and two electrode pins 21 (i.e., a cathode and an anode), the two electrode pins 21 being located on the same side of the micro-light emitting device body 20. For the longitudinal micro-LED, the two electrode pins 21 thereof are located on opposite sides of the micro-light emitting device body 20.

The material of the base substrate 10 is, for example, glass. The connecting electrode 11 provided on the substrate 10 is used to be electrically connected with the electrode pins 21 of the micro-light emitting device that is subsequently bonded on the supporting substrate, so as to provide a driving signal for the electrode pins 21, and the specific structure of the connecting electrode 11 is not limited in the present disclosure.

A driving circuit (not shown) on the base substrate 10 may adopt an active driving structure or a passive driving structure, and a driving signal may be supplied to the connecting electrode 11 through the driving circuit to drive the micro-light emitting device. The active driving structure and the passive driving structure are conventional structures, and will not be described in detail here.

According to an embodiment of the present disclosure, the structure of the supporting substrate is designed such that the supporting substrate is bonded with the micro-light emitting device in a clamping and fixing manner; specifically, a clamping electrode is used to bond the electrode pins 21 of the micro-light emitting device in a clamping and fixing manner, i.e., the clamping electrode "clamps" the electrode pins 21 of the micro-light emitting device. Compared with the plug-in bonding mode in the related art, the embodiment of the present disclosure can greatly reduce the risk of damaging the micro-light emitting device in the bonding process, thereby improving the process yield.

In some embodiments, the clamping electrode 13b includes: a side conductive portion 132 extending in a direction away from the base substrate 10, an inscribed angle formed by the side conductive portion 132 and a plane parallel to the base substrate 10 being an acute angle.

Figure 7A:
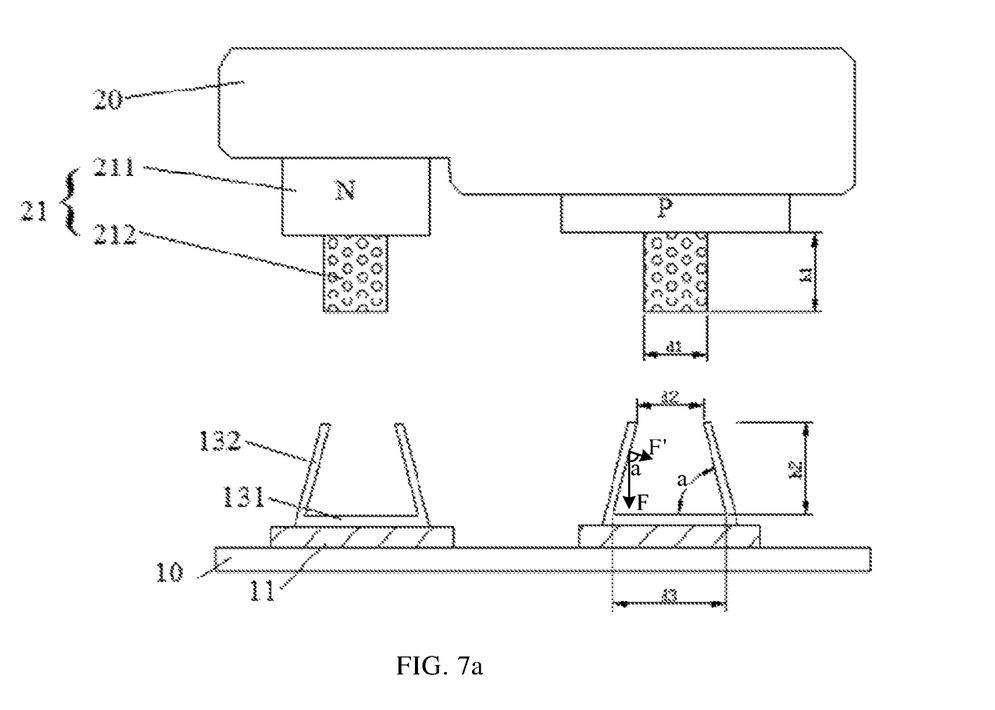
FIGS. 7a and 7b are schematic diagrams of a structure of a micro-light emitting device at different stages in a bonding process according to an embodiment of the present disclosure.
Figure 7B:
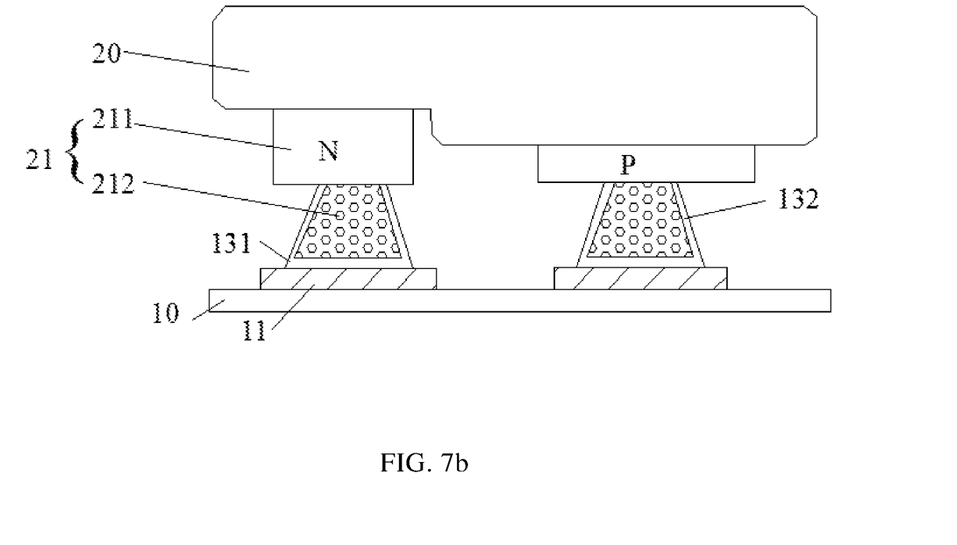

With continued reference to FIG. 2, the clamping electrode 13b forms a receiving space having a small upper opening and a large bottom opening. Referring to FIGS. 7a and 7b, when bonding the electrode pins 21 of the micro-light emitting device subsequently, the electrode pins 21 of the micro-light emitting device are aligned with the opening on the top of the clamping electrode 13b, and then inserted into the receiving space, so that the upper opening of the clamping electrode 13b clamps and fixes the electrode pins 21.

With continued reference to FIGS. 7a and 7b, in some embodiments, a length of pressing the electrode pins 21 may be set to be relatively long (the length of the electrode pins 21 is greater than a height of the side conductive portion 132) so that the electrode pins 21 contact the bottom of the clamping electrode 13b. During the process of inserting the electrode pins 21 into the receiving space, when the electrode pins 21 contact the bottom of the clamping electrode 13b, the bottom of the clamping electrode 13b and the micro-light emitting device body press the electrode pins 21, so that the electrode pins 21 expand and deform in a direction parallel to the plane of the base substrate 10 (the horizontal direction in FIGS. 7a and 7b), and at this time, the firmness of clamping and fixing the electrode pins 21 by the clamping electrode 13b can be improved. Meanwhile, when the side conductive portion 132 is subject a downward pressing force from the micro-light emitting device, the upper opening of the side conductive portion 132 moves toward an inner side of the receiving space, so that the electrode pins 21 received therein are further pressed, and the firmness of clamping and fixing the electrode pins 21 is further improved.

It is found in the process of designing and adjusting the inscribed angle that if the inscribed angle is too small, the area occupied by the side conductive portion 132 will be too large, which will greatly deteriorate the resolution of the supporting substrate; if the inscribed angle is too large, the side conductive portion 132 is easily inserted into the micro-light emitting device body 20, thereby causing damage to the micro-light emitting device body 20, and the receiving space formed by the side conductive portion 132 will be too large, the deformation amount required by the electrode pins 21 of the micro-light emitting device will be too great, which will exhibit a great difficulty in carrying out the process. On the other hand, the dimensional parameters of the electrode pins 21 to be clamped and fixed need to be taken into account. For example, if the height of the electrode pins 21 to be clamped and fixed is relatively high and the cross-sectional area is relatively small, the inscribed angle is to be relatively large. In view of the above, in some embodiments, the range of the inscribed angle includes [60°, 70°].

In some embodiments, the clamping electrode 13b further includes: a bottom conductive portion 131 located between the side conductive portion 132 and the connecting electrodes 11; an end surface of the side conductive portion 132 facing the base substrate 10 is connected with the bottom conductive portion 131.

That is, the bottom conductive portion 131 and the side conductive portion 132 connected with the bottom conductive portion 131 may be formed on the connecting electrode 11. Of course, the side conductive portion 132 may also be formed only on the connecting electrode 11.

In some embodiments, the side conductive portion 132 and the bottom conductive portion 131 are of an integrally formed structure. Thus, the side conductive portion 132 and the bottom conductive portion 131 may be formed of the same material layer to simplify the manufacturing process of the supporting substrate.

Figure 8A:
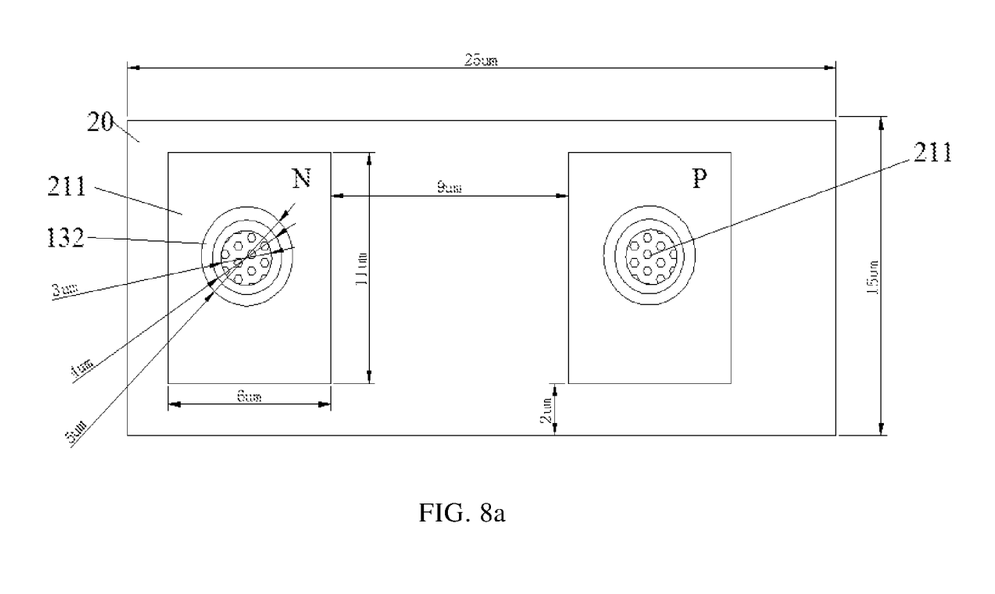

In some embodiments, referring to FIG. 8a, an orthographical projection of the side conductive portion 132 on the base substrate 10 is in a shape of a ring. That is, the receiving space defined by the side conductive portion 132 is in a truncated cone shape.

Figure 8B:
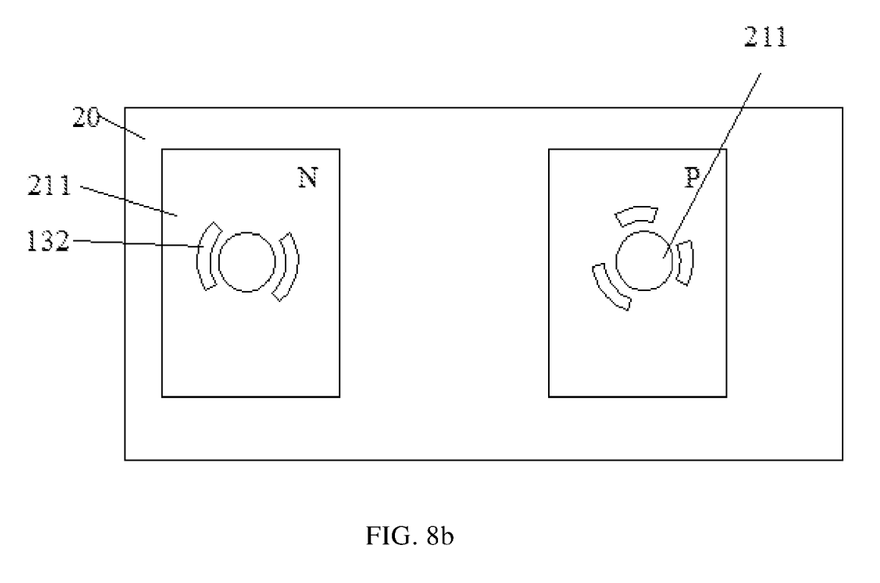

In some embodiments, the orthographic projection of the side conductive portion 132 on the base substrate 10 is in a shape of a ring having at least one gap extending through the inner and outer boundaries of the ring, see FIG. 8b. The side conductive portion 132 does not completely cover the side surface of the receiving space formed thereby as long as the conductive portion 132 clamps the electrode pins 21 of the micro-light emitting device.

In some embodiments, a clamping electrode 13b is provided on a side of each connecting electrode 11 facing away the base substrate 10.

The embodiments of the present disclosure also provide a micro-light emitting device. Referring to FIG. 3, the micro-light emitting device includes a micro-light emitting device body 20 and a plurality of electrode pins 21 connected with the micro-light emitting device body 20. In some embodiments, the number of the electrode pins 21 is two, and the electrode pins 21 of the micro-light emitting device may be clamped and fixed by the clamping electrodes 13b described above.

In some embodiments, the electrode pins 21 are of a stacked structure; specifically, the stacked electrode pins 21 include: a first electrode portion 211 and a second electrode portion 212 which are stacked, the second electrode portion 212 being electrically connected with the micro-light emitting device body 20 through the first electrode portion 211, a hardness of the second electrode portion 212 being smaller than a hardness of the first electrode portion 211.

In some embodiments, the material of the second electrode portion 212 comprises aluminum and the material of the first electrode portion 211 comprises at least one of nickel and molybdenum.

In the bonding process, the second electrode portion 212 is used for clamping and fixing the electrode pins 21. By providing the relatively hard first electrode portion 211 between the second electrode portions 212, the contact between the electrode pins 21 and the micro-light emitting device body 20 in the process of clamping the second electrode portion 212 can be effectively avoided, so that the micro-light emitting device body 20 is better protected. Meanwhile, since the first electrode portion 211 is harder than the second electrode portion 212, when the electrode pins 21 are pressed in a direction perpendicular to the base substrate 10, the second electrode portion 212 is more easily deformed by pressing, while the first electrode portion 211 can still maintain its original shape, that is, a "back seat" is provided for pressing of the second electrode portion 211.

In some embodiments, the orthographic projection of the second electrode portion 212 on the first electrode portion 211 is within the first electrode portion 211, and has a non-overlapping area with the first electrode portion 211. In the bonding process, when the upper opening of the side conductive portion 132 contacts with the second electrode portion 212 and the micro-light emitting device continues to be pressed down by a downward pressing force from the first electrode portion 211, the upper opening of the side conductive portion 132 moves toward an inner side of the receiving space, so as to further press the electrode pins 21 received therein, thereby further improving the firmness of clamping and fixing the electrode pins 21.

Therefore, in the bonding process, even if the pressure applied to the micro-light emitting device is too large or the micro-light emitting device moves down for a too large distance, the clamping electrode 13 does not contact with the micro-light emitting device body 20, which effectively prevents the micro-light emitting device body 20 from being damaged.

In some embodiments, the orthographic projection of the second electrode portion 212 on the first electrode portion 211 is circular. That is, the second electrode portion 212 is cylindrical. Of course, the orthogonal projection of the second electrode portion 212 on the first electrode portion 211 may be in other shapes such as triangular and rectangular.

Figure 4:
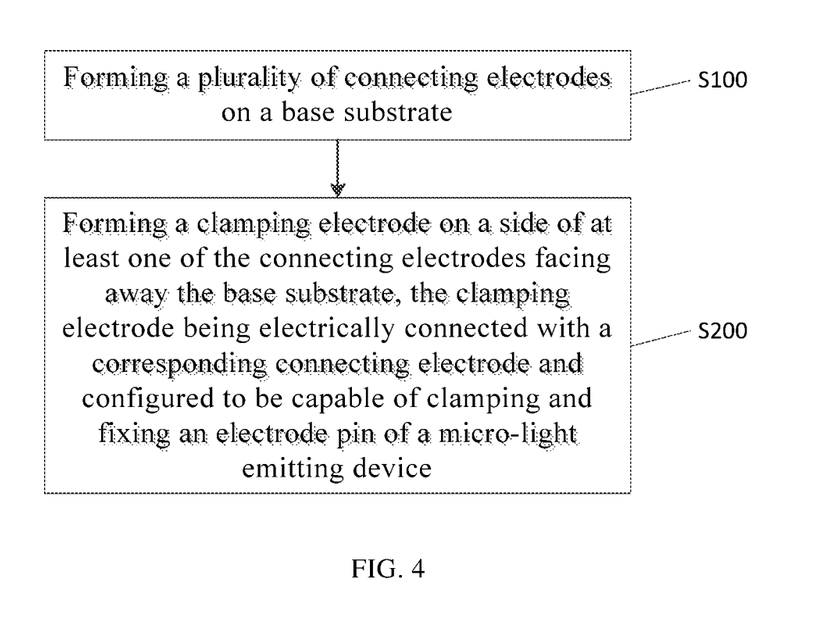
FIG. 4 is a flowchart of a manufacturing method for a supporting substrate according to an embodiment of the present disclosure.

Referring to FIG. 4, an embodiment of the present disclosure further provides a manufacturing method for the supporting substrate, including steps S100 and S200 described below.

Step S100 includes forming a plurality of connecting electrodes 11 on the base substrate 10.

Step S200 includes forming a clamping electrode on a side of at least one of the connecting electrodes 11 facing away the base substrate 10, the clamping electrode being electrically connected with a corresponding connecting electrode 11, and configured to be capable of clamping and fixing the electrode pins 21 of the micro-light emitting device.

The supporting substrate manufactured by the method can fix the electrode pins 21 of the micro-light emitting device in a clamping and fixing manner, so that damage to the micro-light emitting device is avoided.

Figure 5:
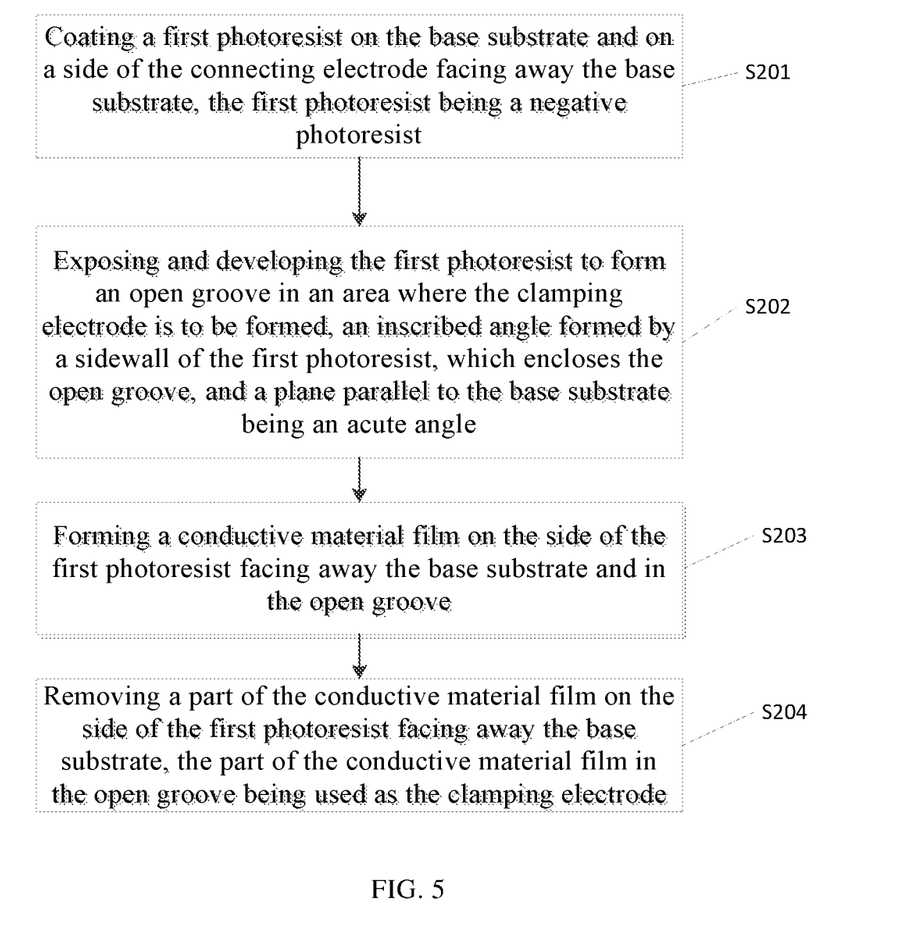
FIG. 5 is a flowchart of a method of forming a clamping electrode according to an embodiment of the present disclosure.

In some embodiments, referring to FIG. 5, the step S200 of forming the clamping electrode includes the following steps S201 to S204.

Step S201 includes coating a first photoresist 12 on the base substrate 10 and on a side of the connecting electrode 11 facing away the base substrate 10, the first photoresist 12 being a negative photoresist.

Figure 6A:
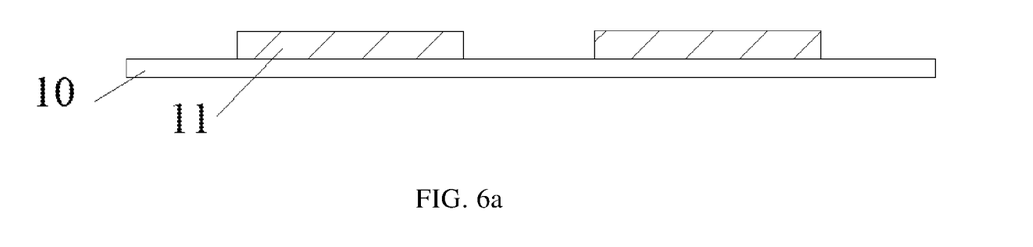
FIGS. 6a-6h are schematic diagrams of a structure of a supporting substrate at different stages of manufacturing according to an embodiment of the present disclosure.
Figure 6B:
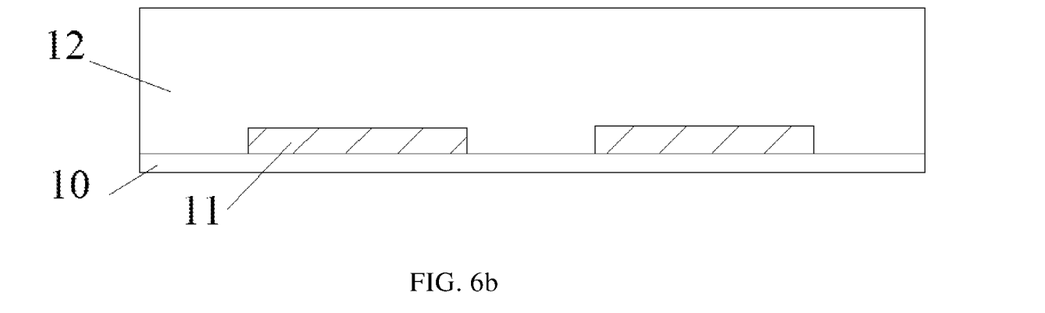

Referring to FIGS. 6a and 6b, FIG. 6a illustrates the supporting substrate before the negative photoresist is not coated, and FIG. 6b illustrates the supporting substrate after S201 is completed.

Step S202 includes exposing and developing the first photoresist 12 to form an open groove in an area 12a where the clamping electrode is to be formed, wherein an inscribed angle formed by a sidewall on the first photoresist 12, which encloses the open groove, and a plane parallel to the base substrate 10 is an acute angle.

Figure 6C:
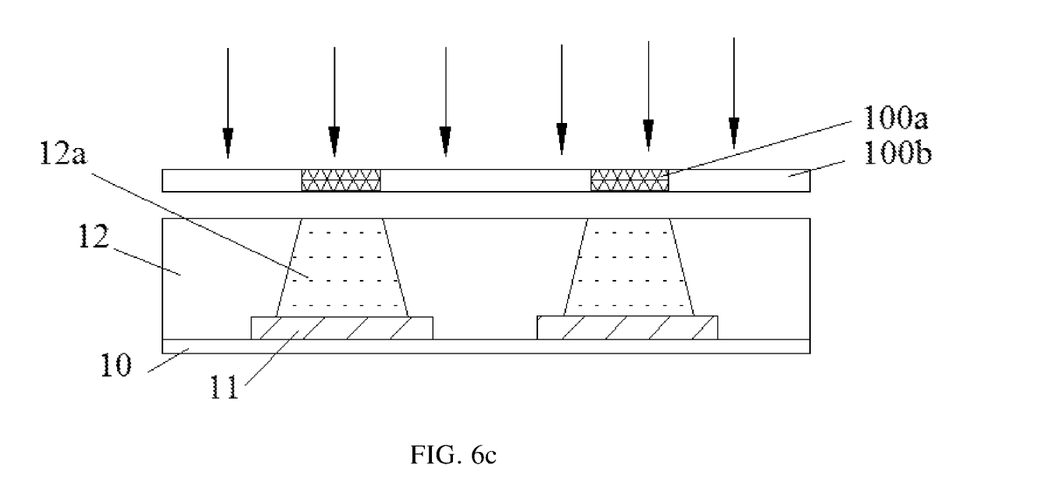
Figure 6D:
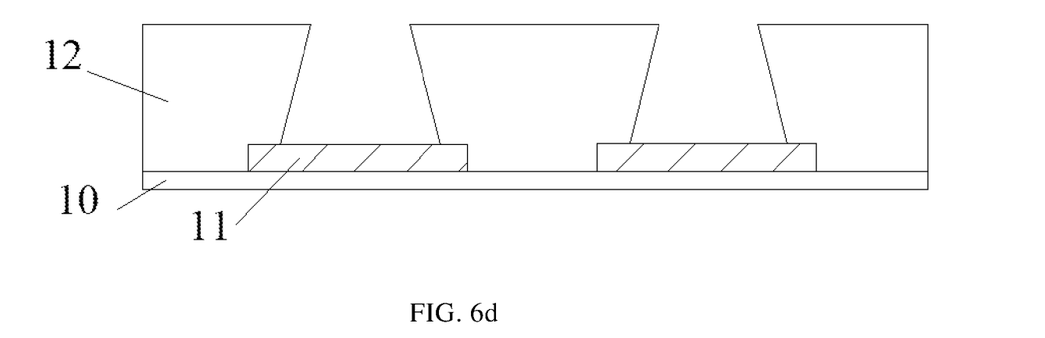

Referring to FIGS. 6c and 6d, the first photoresist 12 corresponding to a light-transmissive area 100b of the mask is retained after subsequent exposure and development.

Since negative photoresist is adopted, the negative photoresist in the illuminated area has a curing reaction, and the light emitted from the surface farther away from the negative photoresist is weaker, so that the area of negative photoresist which has a curing reaction on the surface farther away from the photoresist is smaller, and the area of negative photoresist which has no curing reaction (which is removed by a developing process later) is larger, thus the area of the upper surface of the first photoresist 12 which is remained after development is larger than the area of the lower surface thereof. The non-light-transmissive area 100a of the mask corresponds to the first photoresist 12 to be removed, thus the area of the upper surface of the first photoresist 12 which is removed by development is smaller than the area of the lower surface thereof, so that an open groove with an opening smaller than the bottom is formed. FIG. 6c illustrates a portion 12a to be removed of the first photoresist 12 that is formed after development; FIG. 6d illustrates the first photoresist 12 after the development.

The control of the shape of the open groove can be realized by adjusting the parameters in the exposing process and the developing process at the same time. For example, if the light intensity in the exposing process is stronger, and the developing time in the developing process is longer, the inscribed angle formed by the sidewall of the first photoresist 12, which encloses the open groove, and the plane parallel to the substrate 10 would be larger.

Step S203 includes forming a conductive material film 13' on the side of the first photoresist 12 facing away the base substrate 10 and in the open groove.

Figure 6E:
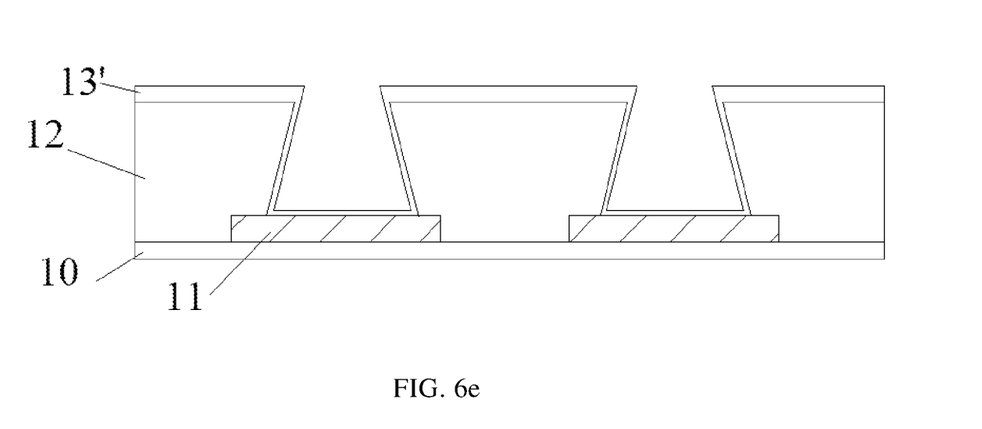

Referring to FIG. 6e, a sputtering process may be specifically employed, the thickness of the conductive material film 13' at the bottom of the open groove being about 6000 Å and the thickness of the conductive material film 13' on the sidewall of the open groove being about 2500 Å. In some embodiments, the material of the conductive material film 13' is aluminum. Of course, the inscribed angle formed by the sidewalls of the open groove and the plane parallel to the base substrate 10 should not be designed to be too small, if the inscribed angle is too small, the conductive material film 13' is not easily formed at the corner of the open groove.

Step S204 includes removing the part of the conductive material film 13' on the side of the first photoresist 12 facing away the base substrate 10, wherein the part of the conductive material film 13' in the groove is used as a clamping electrode.

The bottom conductive portion 131 and the side conductive portion 132 of the clamping electrode may be formed at the same time based on step S204, and the inscribed angle formed by the side conductive portion 132 and the bottom conductive portion 131 is an acute angle. Wherein, the bottom conductive portion 131 and the side conductive portion 132 are of an integrally formed structure.

In some embodiments, after the step of removing the part of the conductive material film 13' on the side of the first photoresist 12 facing away the base substrate 10, the method further includes: removing residual first photoresist 12. Thus, the side conductive portion 132 is more easily pressed by the second electrode portion 212.

Figure 6F:
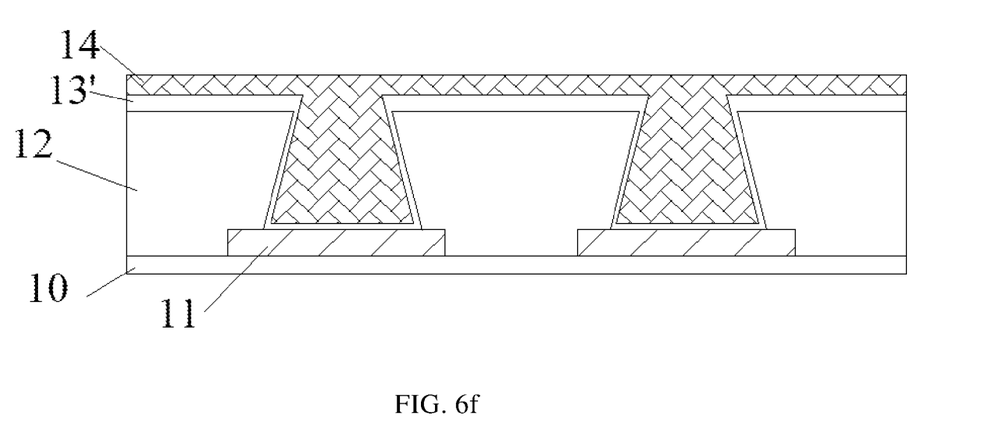
Figure 6G:
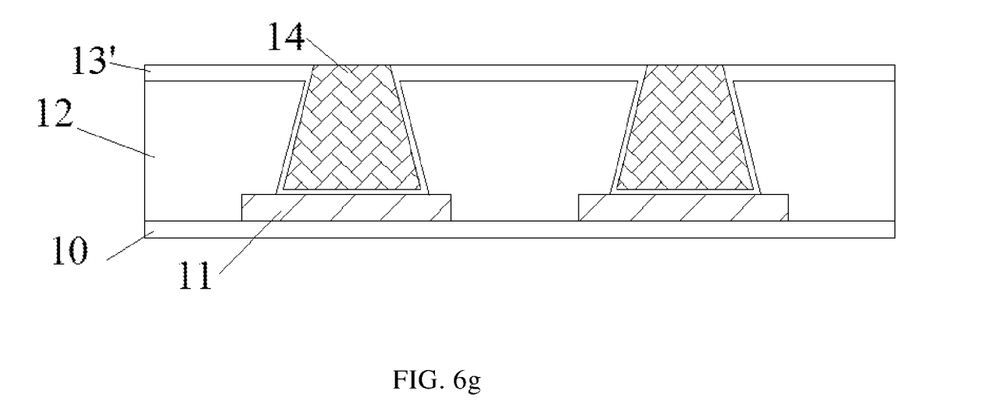
Figure 6H:
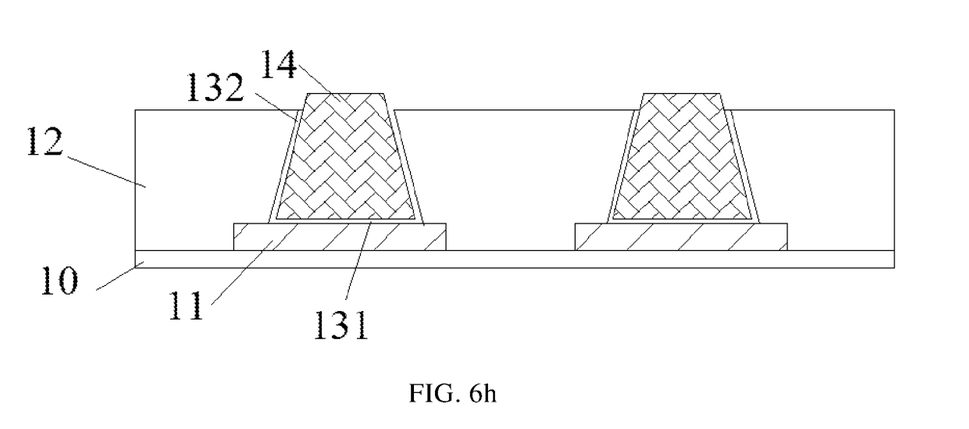

In some embodiments, the step S204 of removing the part of the conductive material film 13' on the side of the first photoresist 12 facing away the base substrate 10 includes: step S2041 and step S2042, see FIGS. 6f to 6h.

Step S2041 includes coating a second photoresist 14 on the side of the conductive material film 13' facing away the base substrate 10 and in the open groove.

Step S2042 includes removing the second photoresist 14 of a predetermined thickness to expose the part of the conductive material film 13' on the side of the first photoresist 12 facing away the base substrate 10.

In some embodiments, the second photoresist 14 of a predetermined thickness is removed by using a plasma etching process (e.g., an oxygen plasma etching process). Of course, this step may be replaced by removing the conductive material film 13' on the side of the first photoresist 12 facing away the base substrate 10 by exposure and development.

Step S2042 includes removing the part of the conductive material film 13' on the side of the first photoresist 12 facing away the base substrate 10 by an etching process.

The residual first photoresist 12 and residual second photoresist 14 may be removed simultaneously. The residual first photoresist 12 and residual second photoresist 14 are removed, for example, by a step of oxygen plasma etching in combination with cleaning.

The embodiments of the present disclosure also provide a backplane, including: the supporting substrate provided in the foregoing embodiments.

In some embodiments, the backplane further includes: a micro-light emitting device provided by at least one of the foregoing embodiments, at least one electrode pin 21 of the micro-light emitting device is clamped and fixed by a clamping electrode.

In some embodiments, with continued reference to FIG. 7b, a micro-light emitting device includes: a light emitting device body 20 and an electrode pin 21, the electrode pin 21 including: a first electrode portion 211 and a second electrode portion 212 which are stacked, the second electrode portion 212 being electrically connected with the light emitting device body through the first electrode portion 211; a hardness of the second electrode portion 212 is smaller than a hardness of the first electrode portion 211.

In some embodiments, the hardness of the second electrode portion 212 is smaller than the hardness of the clamping electrode.

In some embodiments, there is a non-overlapping area between the second electrode portion 212 and the first electrode portion 211, and the clamping electrode includes the side conductive portion 132, and the side conductive portion 132 abuts against a portion of the first electrode portion 211 that is not covered by the second electrode portion 212.

In some embodiments, the backplane having micro-light emitting devices may be used as a display substrate, and all micro-light emitting devices include micro-light emitting devices capable of emitting light of different colors to display pictures.

In some embodiments, the backplane having micro-light emitting devices may serve as a light source assembly (e.g., backlight, illumination lamp) to provide light.

The embodiments of the present disclosure also provide a bonding method for the micro-light emitting device, which is based on the supporting substrate and the micro-light emitting device provided by the foregoing embodiments.

As shown in FIG. 7a, first, the second electrode portion 212 of the micro-light emitting device is aligned with the opening area formed by the clamping electrode, and the top surface of the side conductive portion 132 is opposed to the non-overlapping area between the first electrode portion 211 and the second electrode portion 212.

As shown in FIG. 7b, the micro-light emitting device and the supporting substrate are then pressed against each other to expand the end face of the second electrode portion 212 and to press the first electrode portion 211 and the side conductive portion 132 against each other.

The duration of the pressing process needs to be relatively short so that the second electrode portion 212 is pressed to be significantly deformed. The specific process parameters may be determined by experiments. Since the side conductive portion 132 is relatively inclined, the inclination of the side conductive portion 132 would be increased by the pressing action of the first electrode portions 211, thereby further clamping the second electrode portions 212. The side conductive portion 132 is similar to a "clip" that is made to clamp tightly by the first electrode portion 211.

In some embodiments, the hardness of the first electrode portion 211 is equal to or less than that of the side conductive portion 132. In the bonding process, the first electrode portion 211 may press down the inclined side conductive portion 132, since the side conductive portion 132 is relatively thin, so that the first electrode portion 211 should not be too hard to prevent the side conductive portion 132 from deforming or breaking during the bonding process. Even if the first electrode portion 211 is relatively soft, the side conductive portion 132 is inserted obliquely into the first electrode portion 211, and the first electrode portion 211 is not easily penetrated. Of course, in some embodiments, the hardness of the first electrode portion 211 may also be slightly greater than that of the side conductive portion 132.

The material of the first electrode portion 211 and the second electrode portion 212 is not particularly limited as long as the hardness thereof meets the requirements of each embodiment of the present invention.

In one specific example, with continued reference to FIGS. 7a to 8b, the cathode N and the anode P of the horizontal micro-light emitting diode have the same size, wherein the cross section of the first electrode portion 211 is a rectangle of 11 μm×6 μm, the horizontal distance between the adjacent cathode N and anode P is 9 μm, the cross section of the entire micro-light emitting diode body 20 is a rectangle of 25 µm×15 µm, and the short side of the first electrode portion 211 is spaced from the boundary of the opposite micro-light emitting diode body 20 by 2 µm. The cross section of the second electrode portion 212 is circular with a diameter d1=3 µm, and the second electrode portion 212 has a thickness h1=2.5 µm. Before bonding, a dihedral angle a (i.e. an inscribed angle) formed between the bottom conductive portion 131 and the side conductive portion 132 satisfies 60°≤a≤70°; a top opening of the side conductive portion 132 is circular with a diameter d2=4 µm, a longitudinal distance from the side conductive portion 132 to the bottom conductive portion 131 h2=2 µm, and the bottom of the side conductive portion 132 is also circular with a diameter d3, wherein $$d3 = d2 + \frac{2*h2}{\tan a},$$

when the micro-light emitting diode applies a downward pressing force F to the side conductive portion 132, a component force F' in a direction perpendicular to the side conductive portion 132 satisfies F'=F*cos a, the side conductive portion 132 is deformed under the component force F', and the dihedral angle a is slightly reduced. By adopting the bonding method, the side conductive portion 132 can clamp the second electrode portion 212 tightly, and the first electrode portion 211 is not easily penetrated, thereby improving the process yield.

It should be understood that above embodiments are just examples for illustrating the principle of the invention, however, the invention is not limited thereto. Various modifications and variations can be made by a person skilled in the art without departing from the spirit and the scope of the present invention. These modifications and variations should be considered to be within protection scope of the present invention.

LIST OF REFERENCE SIGNS 10. base substrate
11. connecting electrode
12. first photoresist
12a. area where a clamping electrode is to be formed
13a. cylindrical electrode
13'. conductive material film
131. bottom conductive portion
132. side conductive portion
100a. non-light-transmissive area of the mask
100b. light-transmissive area of the mask
14. second photoresist
N. cathode
P. anode
20. micro-light emitting device body
21a. electrode pins of micro-light emitting diode in the related art
21. electrode pins of micro-light emitting device in the present disclosure
211. first electrode portion
212. second electrode portion

What is claimed is:

1. A supporting substrate, comprising: a base substrate and a plurality of connecting electrodes provided on the base substrate, wherein a clamping electrode is provided on a side of at least one of the connecting electrodes facing away the base substrate, the clamping electrode being electrically connected with a corresponding connecting electrode, and configured to clamp and fix an electrode pin of a micro-light emitting device, and the clamping electrode is provided with a recess on a side of the clamping electrode facing away the base substrate, the recess opens toward a side of the recess facing away the base substrate, an aperture of the recess gradually decreases in a direction away from the base substrate, and the recess is configured to accommodate at least a portion of the electrode pin of the micro-light emitting device.

2. The supporting substrate according to claim 1, wherein the clamping electrode comprises: a side conductive portion extending toward a direction far away from the base substrate, an inscribed angle formed by the side conductive portion and a plane parallel to the base substrate being an acute angle.

3. The supporting substrate according to claim 2, wherein a range of the inscribed angle comprises [60°, 70°].

4. The supporting substrate according to claim 2, wherein the clamping electrode further comprises: a bottom conductive portion located between the side conductive portion and the connecting electrode;
an end face of the side conductive portion facing the base substrate is connected with the bottom conductive portion.

5. The supporting substrate according to claim 4, wherein the side conductive portion and the bottom conductive portion are of an integrally formed structure.

6. The supporting substrate according to claim 2, wherein an orthographic projection of the side conductive portion on the base substrate is in a shape of a ring.

7. The supporting substrate according to claim 2, wherein an orthographic projection of the side conductive portion on the base substrate is in a shape of a ring having at least one gap extending through inner and outer boundaries of the ring.

8. The supporting substrate according to claim 1, wherein the clamping electrode is provided on a side of each of the connecting electrodes facing away the base substrate.

9. The supporting substrate according to claim 1, wherein material of the clamping electrode comprises: aluminum.

10. A manufacturing method for a supporting substrate, comprising:
forming a plurality of connecting electrodes on a base substrate; and
forming a clamping electrode on a side of at least one of the connecting electrodes facing away the base substrate, the clamping electrode being electrically connected with a corresponding connecting electrode, and configured to clamp and fix an electrode pin of a micro-light emitting device,
wherein the clamping device is provided with a recess on a side of the clamping electrode facing away the base substrate, the recess opens toward a side of the recess facing away the base substrate, an aperture of the recess gradually decreases in a direction away from the base substrate, and the recess is configured to accommodate at least a portion of the electrode pin of the micro-light emitting device.

11. The manufacturing method according to claim 10, wherein the step of forming the clamping electrode comprises:

coating a first photoresist on the base substrate and on the side of the connecting electrodes facing away the base substrate, the first photoresist being a negative photoresist;

exposing and developing the first photoresist to form an open groove in an area where the clamping electrode is to be formed, an inscribed angle formed by a sidewall enclosing the open groove of the first photoresist and a plane parallel to the base substrate being an acute angle;

forming a conductive material film on a side of the first photoresist facing away the base substrate and in the open groove; and removing a part of the conductive material film on the side of the first photoresist facing away the base substrate, wherein the part of the conductive material film in the open groove is used as the clamping electrode.

12. The manufacturing method according to claim 11, wherein after the step of removing the part of the conductive material film on the side of the first photoresist facing away the base substrate, the method further comprising:

removing residual first photoresist.

13. The manufacturing method according to claim 11, wherein the step of removing the part of the conductive material film on the side of the first photoresist facing away the base substrate comprises:

coating a second photoresist on a side of the conductive material film facing away the base substrate and in the open groove;

removing the second photoresist of a predetermined thickness to expose the part of the conductive material film on the side of the first photoresist facing away the base substrate; and removing the part of the conductive material film on the side of the first photoresist facing away the base substrate by an etching process.

14. The method according to claim 13, wherein the second photoresist of the predetermined thickness is removed by using a plasma etching process.

15. A backplane, comprising: the supporting substrate according to claim 1.

16. The backplane according to claim 15 further comprising: at least one micro-light emitting device, the micro-light emitting device having a micro-light emitting device body and a plurality of electrode pins electrically connected with the micro-light emitting device body, at least one electrode pin of the micro-light emitting device being clamped and fixed by the clamping electrode.

17. The backplane according to claim 16, wherein the electrode pin clamped and fixed by the clamping electrode comprises: a first electrode portion and a second electrode portion which are stacked, the second electrode portion being electrically connected with the micro-light emitting device body through the first electrode portion; a hardness of the second electrode portion is smaller than a hardness of the first electrode portion.

18. The backplane according to claim 17, wherein the clamping electrode clamps and fixes a corresponding second electrode portion.

19. The backplane according to claim 16, wherein the micro-light emitting device comprises: Micro-LED or Mini-LED.

20. The backplane according to claim 16, wherein the backplane is a display substrate or a light source assembly.

* * * * *